US 6,627,906 B2

(12) United States Patent
Hirayanagi

(10) Patent No.: US 6,627,906 B2
(45) Date of Patent: Sep. 30, 2003

(54) CONTROL OF EXPOSURE IN CHARGED-PARTICLE-BEAM MICROLITHOGRAPHY BASED ON BEAM-TRANSMISSIVITY OF THE RETICLE

(75) Inventor: Noriyuki Hirayanagi, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/132,785

(22) Filed: Apr. 24, 2002

(65) Prior Publication Data

US 2002/0153496 A1 Oct. 24, 2002

(30) Foreign Application Priority Data

Apr. 24, 2001 (JP) ........................................ 2001-125564

(51) Int. Cl.⁷ ........................ H01J 37/08; H01J 37/304; G21K 5/10
(52) U.S. Cl. .............................. 250/492.23; 250/491.1; 250/492.2; 250/492.22; 430/4
(58) Field of Search .......................... 250/491.1, 492.1, 250/492.2, 492.21, 492.22, 492.23, 492.3, 396 R, 397, 398, 400; 438/680

(56) References Cited

U.S. PATENT DOCUMENTS

| | | | | |
|---|---|---|---|---|
| 5,936,252 A | * | 8/1999 | Stickel et al. ............ | 250/491.1 |
| 5,994,708 A | * | 11/1999 | Nakasuji ................... | 250/398 |
| 6,262,427 B1 | * | 7/2001 | Gordon ................... | 250/492.22 |
| 6,277,542 B1 | * | 8/2001 | Okino et al. ................ | 430/296 |
| 6,352,799 B1 | * | 3/2002 | Nakasuji ................ | 250/492.22 |
| 6,403,971 B1 | * | 6/2002 | Kawata .................... | 250/491.1 |
| 6,414,743 B1 | * | 7/2002 | Nishi et al. ................... | 355/30 |
| 6,429,441 B1 | * | 8/2002 | Nakasuji ..................... | 250/397 |
| 2001/0046631 A1 | * | 11/2001 | Fujiwara et al. ............... | 430/5 |
| 2001/0052579 A1 | * | 12/2001 | Kawata et al. ......... | 250/492.22 |
| 2002/0000524 A1 | * | 1/2002 | Suzuki et al. .......... | 250/492.21 |
| 2002/0115309 A1 | * | 8/2002 | Nakasuji ..................... | 438/800 |
| 2002/0123168 A1 | * | 9/2002 | Okino et al. ................... | 438/49 |

OTHER PUBLICATIONS

U.S. patent application Ser. No. 09/659,205, filed Sep. 11, 2000, Hirayanagi.
U.S. patent application Ser. No. 09/659,211, filed Sep. 11, 2000, Hirayanagi.
Mkrtchyan et al., "Electron scattering and transmission through Scalpel masks," *J. Vac. Sci. Techno. B*, 16(6): pp. 3385–3391, Nov./Dec. 1998.
Golladay et al., "High emittance source for the Prevail projection lithography system," *J. Vac. Sci. Techno. B*, 17(6): pp. 2856–2859, Nov./Dec. 1999.
Suzuki et al., "Nikon EB Stepper: the latest development status," *Emerging Lithographic Technologies V*, vol. 4343: pp. 80–87, 2001.

* cited by examiner

Primary Examiner—John R. Lee
Assistant Examiner—Bernard E. Souw
(74) Attorney, Agent, or Firm—Klarquist Sparkman LLP

(57) ABSTRACT

Charged-particle-beam (CPB) microlithography methods are disclosed in which exposure dose on the lithographic substrate is controlled and adjusted as required to achieve proper exposure and maximal throughput, regardless of beam-transmissivity (e.g., membrane thickness) of the reticle in use. A reticle is provided with a transmitted-current-detection window exhibiting the same beam-transmissivity and forward-scattering behavior as a non-scattering membrane portion of the pattern-defining portion of the reticle. A charged-particle illumination beam is directed at the transmitted-current-detection window of the reticle. The beam current passing through the transmitted-current-detection window and reaching the wafer stage is sensed by a sensor located at or on the wafer stage. From the obtained beam-current data, a controller calculates the beam-current density on the wafer stage and calculates and sets a corresponding exposure time for exposing the wafer with an appropriate amount of exposure energy. Lithographic exposure is performed according to the set exposure time.

18 Claims, 6 Drawing Sheets

CONTROL OF EXPOSURE IN CHARGED-PARTICLE-BEAM MICROLITHOGRAPHY BASED ON BEAM-TRANSMISSIVITY OF THE RETICLE

FIELD

This disclosure pertains to microlithography of a pattern, defined by a reticle or mask (generally termed "reticle" herein) from the reticle to a sensitive substrate (e.g., a semiconductor wafer coated with a substance, termed a "resist," that is imprintable with an image of the pattern) using an energy beam. Microlithography is a key technique used in the manufacture of microelectronic devices such as integrated circuits, displays, magnetic pickup heads, and micromachines. More specifically, the disclosure pertains to microlithography performed using a charged particle beam (e.g., electron beam or ion beam) as the energy beam. Even more specifically, the disclosure pertains, in the context of charged-particle-beam microlithography, to obtaining a desired exposure dose on the substrate regardless of the thickness of the membrane portion of the reticle, thereby allowing throughput to be increased.

BACKGROUND

Charged-particle-beam (CPB) microlithography offers prospects of substantially higher pattern-transfer resolution than currently achievable using optical microlithography. Unfortunately, throughput achievable with CPB microlithography still is substantially less than the throughput achievable with optical microlithography. ("Throughput" denotes the number of production units such as wafers that can be processed per unit time using the subject technology.) Substantial development efforts in CPB microlithography have been directed to improving throughput.

The main reason for low throughput with CPB microlithography is the current impossibility of fabricating a reticle defining the entire pattern in a manner allowing the entire pattern to be exposed in a single exposure "shot." Another reason is the current impossibility of providing illumination and projection "optics" capable of projecting an entire pattern in a single shot while also providing satisfactorily low aberrations in the projected image.

One current example of a CPB microlithography technology that has been put to practical use is "cell projection," which involves the repeated transfer and exposure of a limited number of types of graphic portions of a device pattern (hence, this technique also is termed "graphic-portion batch exposure"). The graphic portions are defined as respective apertures in an aperture plate that are exposed in a mix-and-match manner so as to reconstruct the pattern portion-by-portion on the substrate. Unfortunately, the maximal throughput obtainable using graphic-portion batch exposure is about one order of magnitude too low for practical application in actual mass-production of semiconductor chips.

To improve throughput over that obtainable using cell projection, so-called "divided reticle" reduction projection-exposure apparatus have been developed for CPB microlithography. In the divided-reticle technique, the entire chip pattern as defined on the reticle is divided into multiple "subfields" each defining a respective portion of the overall pattern. The apparatus directs a charged-particle illumination beam to illuminate a selected subfield on the reticle. Portions of the illumination beam passing through the illuminated portion of the reticle are projected by a projection-optical system onto a corresponding selected region on the substrate. The subfields are projected according to a predetermined order, and are imaged such that the images of the subfields are placed contiguously with each other (i.e., "stitched" together) on the substrate. Projection of the images normally is performed with "reduction" (demagnification); hence, the image of a subfield on the substrate is smaller (usually by an integer factor such as 4 or 5) than the corresponding subfield on the reticle. Further details of this technique can be found in U.S. Pat. No. 5,260,151, incorporated herein by reference, and in Japan Kôkai (Laid-Open) Patent Document No. Hei 8-186070.

In divided-reticle CPB microlithography, generally two types of reticles are used: non-stenciled-membrane reticles and stenciled-membrane reticles, as shown in FIGS. 7(A) and 7(B), respectively. Both types of reticles are fabricated from a semiconductor wafer (typically silicon). The reticles are shown in the figures as respective elevational sections of a portion of each. The non-stenciled-membrane reticle also is termed a "scattering-membrane" reticle, and the stenciled-membrane reticle also is termed a "scattering-stencil" reticle.

The non-stenciled-membrane reticle 10-1 shown in FIG. 7(A) comprises, for example, a $SiN_x$ (silicon nitride) layer 62 formed on the "lower" (downstream-facing) surface of a Si (silicon) substrate 61. The $SiN_x$ layer 62 is relatively non-scattering to charged particles of an illumination beam EB incident from an upstream direction. I.e., incident charged particles pass through the $SiN_x$ layer 62 with little to no forward scattering. On the "lower" surface of the $SiN_x$ layer 62 is a W (tungsten) layer 63. The W layer 63 is highly scattering to charged particles of the incident illumination beam EB. I.e., incident charged particles pass through the W layer 63 with substantial forward scattering. After forming the layers 62, 63 the Si substrate 61 is removed by anisotropic dry-etching or the like from regions corresponding to subfields 64, thereby forming in the subfields 64 respective self-supporting membrane portions 65 composed of the $SiN_x$ layer 62 and the W layer 63. In the subfields 64, portions of the W layer 63 are selectively removed to form non-scattering regions 66 and scattering regions 67. In each subfield 64, the non-scattering regions 66 and scattering regions 67 collectively define, on the membrane 65, a respective portion of the chip pattern to be projected onto a sensitive substrate (not shown).

Whenever the non-stenciled-membrane reticle 10-1 is irradiated with a CPB illumination beam (e.g., electron beam EB), the non-scattering regions 66 transmit respective portions of the beam, with substantially no scattering, to the sensitive substrate. The scattering portions 67, on the other hand, greatly scatter respective portions of the incident beam. The scattered particles propagating downstream of the reticle are absorbed and thus blocked by a contrast aperture or the like (not shown, but see FIG. 1) to prevent them from reaching the sensitive substrate. The non-scattered particles pass through the contrast aperture to the sensitive substrate. Thus, an image of the pattern can be formed with satisfactory contrast on the sensitive substrate.

Referring now to the stenciled-membrane reticle 10-2 shown in FIG. 7(B), the silicon substrate 71 is removed by anisotropic dry-etching or the like from regions corresponding to subfields 74, thereby forming in the subfields 74 respective self-supporting membrane portions 75 composed of residual silicon substrate 71. Portions of the membranes 75 are selectively removed to form beam-transmissive apertures 76. The apertures 76 and remaining portions 77 of the membranes 75 collectively define a pattern to be projected onto a sensitive substrate (not shown).

Whenever the stenciled-membrane reticle 10-2 is irradiated with a CPB illumination beam (e.g., electron beam EB), the apertures 76 transmit respective portions of the beam, with substantially no scattering, to the sensitive substrate. The membrane portions 77, on the other hand, greatly scatter respective portions of the incident beam. The scattered particles propagating downstream of the reticle are absorbed by a contrast aperture or the like to prevent them from reaching the sensitive substrate. The non-scattered particles pass through the contrast aperture. Thus, an image of the pattern can be formed with satisfactory contrast on the sensitive substrate.

The transmissivity of a CPB-transmitting portion of a non-stenciled-membrane reticle used in an electron-beam microlithography apparatus is a function of the thickness of the CPB-transmissive layer, as discussed in *J. Vac. Sci. Technol.* B16:3385, 1998. FIG. 8 is a representative plot of the transmissivity of the CPB-transmitting portion of a non-stenciled-membrane mask, as a function of $SiN_x$ membrane thickness (i.e., thickness of the CPB-transmissive portion of the reticle). The plotted data were obtained using an electron beam subjected to an acceleration voltage of 100 keV and a contrast aperture angle of 0.5 mrad. In FIG. 8, the transmissivity is about 40% whenever the $SiN_x$ film thickness is 50 nm, and about 15% whenever the $SiN_x$ film thickness is 100 nm. Thus, because the transmissivity varies with thickness of the $SiN_x$ film, errors in the $SiN_x$ film thickness can result in substantial variations in exposure-beam current reaching the sensitive substrate, producing substantial errors in exposure.

In a conventional reticle-production process, the $SiN_x$ film is formed by chemical vapor deposition (CVD) on a reticle substrate. Even though CVD can form a substantially uniformly thick layer of $SiN_x$ on a given reticle substrate, it is exceedingly difficult to form this film at a uniform thickness from one reticle substrate to another. This difficulty arises from inherent limitations in the accuracy and precision of layer-thickness control achieved in CVD. Since the transmissivity of the CPB-transmitting portion of the non-stenciled reticle used in divided-reticle CPB microlithography varies with the thickness of the $SiN_x$ film, substantial changes arise in exposure dose whenever the reticle is changed.

Whereas, in non-stenciled-membrane reticles as mentioned above, the transmissivity of the CPB-transmitting portion is a function of the thickness of the $SiN_x$ layer, the transmissivity of the CPB-transmitting portion of a stenciled-membrane is always 100%. Thus, depending on the type of reticle being used, a greater than two-fold difference in the transmissivity of the CPB-transmitting portion could be experienced. Whenever both non-stenciled-membrane reticles and stenciled-membrane reticles are used in the same microlithographic exposure apparatus, a pattern defined on a non-stenciled-membrane reticle with low transmissivity requires an exposure time that is more than twice the exposure time of a pattern defined on a stenciled-membrane reticle. As a result, substantially decreased throughput is achieved when using the non-stenciled-membrane reticle compared to using the stenciled-membrane reticle.

SUMMARY

In view of the shortcomings of conventional apparatus and methods as described above, the present invention provides, inter alia, charged-particle-beam (CPB) microlithography methods and apparatus with which an accurate exposure dose can be obtained regardless of the transmissivity of the membrane of a non-stenciled-membrane reticle being used. Thus, exposure-dose variations conventionally experienced whenever the reticle is changed are prevented, and throughput correspondingly increased.

To such end and according to a first aspect of the invention, charged-particle-beam (CPB) microlithographic exposure methods are provided. In an embodiment of such a method a reticle is placed relative to a charged-particle illumination beam. The reticle defines a pattern to be transferred onto a sensitive substrate and comprises a CPB-transmissive membrane layer and a CPB-scattering layer selectively formed on the CPB-transmissive membrane layer. An illumination beam passes through the CPB-scattering layer with substantial scattering of charged particles of the beam, and passes through the CPB-transmissive membrane layer with relatively little scattering. The CPB-scattering layer and CPB-transmissive membrane layer collectively define elements of the pattern on the reticle, and the charged particles of the beam propagating downstream of the reticle collectively define a patterned beam. Propagation of at least most of the charged particles of the patterned beam that were scattered by passage through the CPB-scattering layer are blocked so as to prevent the blocked charged particles from propagating to the substrate, while the relatively non-scattered charged particles of the patterned beam are projected and imaged onto the substrate. The illumination beam is irradiated on a measurement region of the reticle at which only the CPB-transmissive membrane layer is present, and a beam current of the resulting patterned beam propagating downstream of the region to the substrate is measured. From a pre-set target exposure dose for the substrate and from the measured beam current, an actual exposure condition for the reticle is determined.

In the exposure method summarized above, the reticle including a CPB-transmissive membrane layer and a CPB-scattering layer is termed a "non-stenciled-membrane reticle." With such a reticle the exposure dose at the substrate is accurately and precisely controlled regardless of the thickness (and thus regardless of the CPB transmissivity) of the non-stenciled-membrane reticle. This method also allows a less strict thickness tolerance of the CPB-transmissive membrane layer, which reduces the cost of the reticle.

The illumination beam typically is generated by a CPB source and passed through an illumination-optical system to the reticle. If the measured beam current deviates significantly from a previously specified beam current, then at least one of the CPB source and illumination-optical system can be adjusted so as to bring the beam current on the substrate within a desired range including the previously specified beam current.

According to another embodiment, an electron-beam microlithographic exposure method is performed using an electron-beam microlithographic exposure device comprising an illumination-beam source, an illumination-optical system through which the illumination beam passes, a reticle stage, a projection-optical system through which a patterned beam passes, and a substrate stage including a beam-current sensor. In the method a reticle is mounted on the reticle stage relative to the illumination beam. The reticle defines electron-transmitting (and non-forward-scattering) regions and electron-forward-scattering regions that collectively define a pattern on the reticle, and a transmitted-current-detection window that is as transmissive and non-forward scattering to the illumination beam as any of the electron-transmitting regions of the reticle. The substrate stage is moved to place the beam-current sensor in a beam-current-sensing position, and the reticle stage is moved to place the transmitted-current-detection window at an illumination-beam-irradiation position. The transmitted-current-detection window is irradiated with the illumination beam while a beam current of the resulting patterned beam is measured using the beam-current sensor. A determination is made of whether the measured beam current is outside a predetermined beam-current range defined between lower and upper thresholds. If the measured beam current is outside the predetermined range, then at least one parametric setting of at least one of the illumination-beam source and illumination-optical system is changed so as to bring the measured beam current within the predetermined range. From the measured beam current within the predetermined range, calculations are made of a beam-current density at the substrate stage and an exposure time for exposing the substrate with a specified dose using the reticle.

The method summarized above can include the step of changing the exposure time depending upon whether the reticle is a non-stenciled-membrane reticle or a stenciled-membrane reticle.

Another aspect of the invention is directed, in the context of a CPB microlithographic exposure method in which a pattern defined by a reticle is transferred from the reticle to a sensitive substrate, to methods for controlling exposure at the substrate. In an embodiment of such a method, a reticle is placed relative to a charged-particle illumination beam produced by a CPB source and passing through an illumination-optical system. The reticle defines a pattern to be transferred onto a sensitive substrate. Depending upon whether the reticle is a stenciled-membrane reticle or a non-stenciled-membrane reticle, one or both the CPB source and illumination-optical system is adjusted accordingly to achieve a desired exposure at the sensitive substrate. Thus, a situation is prevented in which the required exposure time differs greatly whenever both non-stenciled-membrane reticles and stenciled-membrane reticles are used on the same CPB microlithography apparatus.

The method summarized above can include the step, after at least one of the CPB source and illumination-optical system has been adjusted according to the type of reticle, of measuring a CPB beam current as incident on the sensitive substrate. In this instance, exposure conditions for the substrate can be determined from the measured CPB beam current and from a preset exposure dose.

According to another aspect of the invention, CPB microlithographic exposure apparatus are provided. An embodiment of such an apparatus comprises a CPB source that emits an illumination beam toward a reticle defining a pattern to be transferred to a sensitive substrate. The apparatus also includes a reticle stage, an illumination-optical system, a projection-optical system, and a substrate stage. The reticle is mounted on the reticle stage. The illumination-optical system is situated between the CPB source and the reticle stage and is configured to irradiate a region of the reticle with the illumination beam. The projection-optical system is situated downstream of the reticle stage and is configured to project and image a patterned beam, propagating downstream of the reticle and comprising scattered and non-scattered charged particles of the illumination beam passing through the illuminated region of the reticle, onto the sensitive substrate. The substrate stage is situated downstream of the projection-optical system and comprises a beam-current sensor. A sensitive substrate is placed on the substrate stage for exposure. The apparatus also includes a controller that is connected to and configured to control respective operations of the CPB source, the illumination-optical system, the reticle stage, the projection-optical system, the substrate stage, and the beam-current sensor. A beam current of the patterned beam reaching a position on the sensitive substrate is measured by the beam-current sensor. The controller calculates exposure conditions for the sensitive substrate based on which of a plurality of types of reticles is mounted to the reticle stage and based on the beam current sensed by the beam-current sensor.

In the apparatus summarized above, whenever a reticle is mounted to the reticle stage, the controller adjusts a parameter of at least one of the CPB source and illumination-optical system based on the type of reticle mounted to the reticle stage. For example, the reticle can be a stenciled-membrane reticle or a non-stenciled-membrane reticle.

According to yet another aspect of the invention, reticles are provided for use in CPB microlithography. An embodiment of such a reticle comprises a CPB-transmissive membrane layer and a CPB-scattering layer selectively formed on the CPB-transmissive layer. A charged particle beam can pass through the CPB-scattering layer with substantial forward scattering of charged particles of the beam and can pass through the CPB-transmissive membrane layer with relatively little forward scattering. The CPB-scattering layer and CPB-transmissive layer collectively define elements of a pattern on the reticle. The reticle also includes a transmitted-current-detection window spanned by the CPB-transmissive membrane layer but not by the CPB-scattering layer. The transmitted-current-detection window is situated in a region of the reticle that does not define any pattern elements.

The reticle can comprise a pattern-defining region and a non-pattern-defining region. In such a configuration the pattern elements are defined in the pattern-defining region. The pattern-defining region is divided into multiple subfields each defining a respective group of the pattern elements. The transmitted-current-detection window is located in the non-pattern-defining region. The pattern-defining region typically includes support struts separating the subfields from one another.

The foregoing and additional features and advantages of the invention will be more readily apparent from the following detailed description, which proceeds with reference to the accompanying drawings.

DETAILED DESCRIPTION

The invention is described below in the context of representative embodiments, which are not intended to be limiting in any way.

Figure 1:
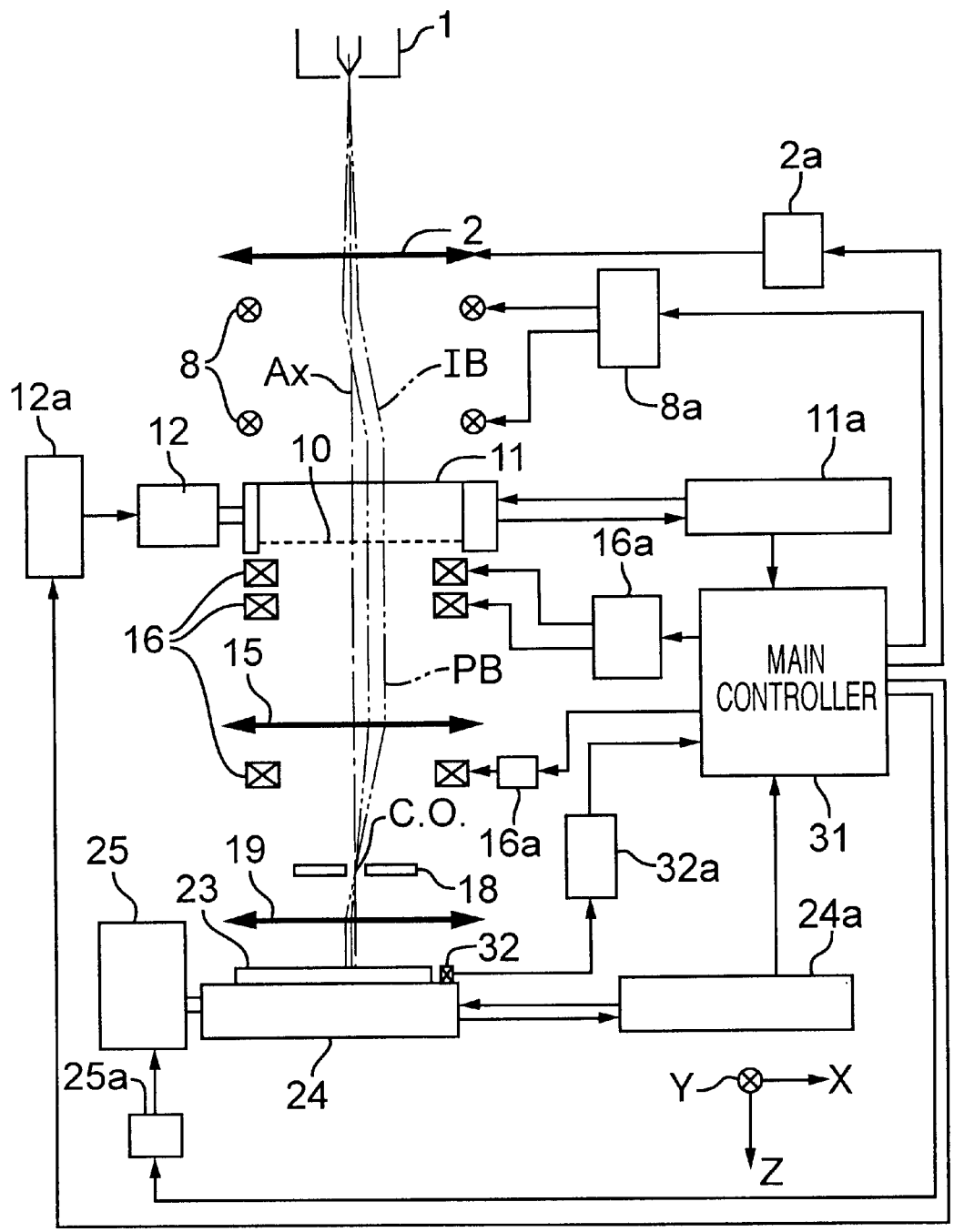
FIG. 1 is a schematic elevational diagram of a representative embodiment of a divided-reticle charged-particle-beam (CPB) microlithography apparatus, showing certain imaging and control relationships.

FIG. 1 depicts, as an exemplary charged-particle-beam (CPB) microlithography apparatus, an electron-beam projection-exposure apparatus according to a representative embodiment. FIG. 1 also schematically depicts the overall electron-optical system and certain imaging and control relationships of the apparatus.

An electron gun 1 is situated at the most upstream location of the electron-optical system. The electron gun 1 emits an electron "illumination beam" IB that propagates along an optical axis Ax in a downstream direction from the electron gun 1. A condenser lens 2, situated downstream of the electron gun 1, converges the illumination beam IB.

The condenser lens 2 and an illumination-beam deflector 8 situated downstream of the condenser lens 2 are respective components of an "illumination-optical system" located upstream of a reticle 10. The deflector 8 successively scans the illumination beam IB mainly in the lateral direction (X direction) in FIG. 1 as required to illuminate each of the various subfields, on the reticle 10, located within the optical field of the illumination-optical system.

The reticle 10 actually has numerous subfields, arrayed within a plane (X-Y plane) perpendicular to the optical axis Ax (discussed later below with reference to FIG. 2). The reticle 10 typically defines the entire pattern of a layer to be formed on a single microelectronic device (i.e., an entire chip pattern). If required or desired, multiple reticles (e.g., two complementary reticles) can be employed for defining the chip pattern. As discussed later below, the reticle 10 also defines a beam-current-detection window used for detecting the beam current of the illumination beam IB being transmitted through the beam-current-detection window.

The reticle 10 is mounted to a movable reticle stage 11, which allows reticle subfields situated outside the field of the illumination-optical system to be irradiated by moving the reticle 10 perpendicularly to the optical axis Ax (i.e., in the X-Y direction). The reticle stage 11 includes a stage-position detector 12 comprising a laser interferometer, by which the position of the reticle stage 11 is monitored accurately in real time.

Portions of the illumination beam IB transmitted through the reticle 10 carry an aerial image of the illuminated portion of the reticle 10. Hence, the beam downstream of the reticle 10 is termed the "patterned beam" PB. The patterned beam PB passes through a "projection-optical system" located between the reticle 10 and a substrate 23. The projection-optical system includes projection lenses 15, 19 and image-position-adjustment deflector 16. The patterned beam PB, formed by passage of the illumination beam IB through a selected subfield on the reticle 10, is imaged at a specific location on the substrate (wafer) 23 by the projection lenses 15, 19 and deflectors 16.

A crossover C.O. is formed at a point, on the optical axis Ax, defined by the demagnification ratio of the projection-optical system. A contrast aperture 18 is provided at, and centered on, the crossover C.O. The contrast aperture 18 blocks portions of the electron beam scattered by passage of the illumination beam IB through the reticle 10. Thus, the scattered electrons are prevented from reaching the wafer 23.

The upstream-facing surface of the wafer 23 is coated with a suitable resist. During exposure the resist is subjected to a dose of the patterned beam PB. The dose imprints the demagnified ("reduced") image of the illuminated pattern portion on the resist and thus on the wafer 23.

The wafer 23 is held by an electrostatic or vacuum chuck (not shown) on a wafer stage 24 (also termed "substrate stage") capable of movement in the X-Y plane. During exposure of successive subfields the reticle stage 11 and the wafer stage 24 are scanned synchronously in mutually opposite directions, thereby allowing each subfield of the chip pattern situated outside the optical field of the projection-optical system to be exposed in a successive and sequential manner.

Provided on the wafer stage 24 is a sensor 32 for sensing the beam current of the electron beam reaching the wafer stage 24. The sensor 32 can be, for example, a Faraday cup. The wafer stage 24 also includes a stage-position detector 25 including a laser interferometer. The stage-position detector 25 functions in a manner similar to the stage-position detector 12 of the reticle stage 11.

The lenses 2, 15, 19 and deflectors 8, 16 are individually controlled by a main controller 31 via respective coil-power-supply controllers 2a, 15a, 19a, 8a, 16a. Similarly, the reticle stage 11 and wafer stage 24 are controlled by the main controller 31 via respective stage controllers 11a and 24a. The stage-position detectors 12, 25 route respective stage-position signals to the main controller 31 via respective interfaces 12a, 25a each including one or more amplifiers, A/D converters, etc., as required. Similarly, the sensor 32 routes signals to the main controller 31 via an interface 32a.

The main controller 31 monitors control errors in the respective positions of the stages 11, 24 and corrects any detected errors using the image-position-adjustment deflectors 16. As a result, the demagnified images of the subfields on the reticle 10 are accurately transferred to their intended respective locations on the wafer 23. The respective locations at which the images are formed serve to "stitch" the images together on the wafer in a contiguous manner, thereby forming the entire chip pattern on the wafer.

Figure 3:
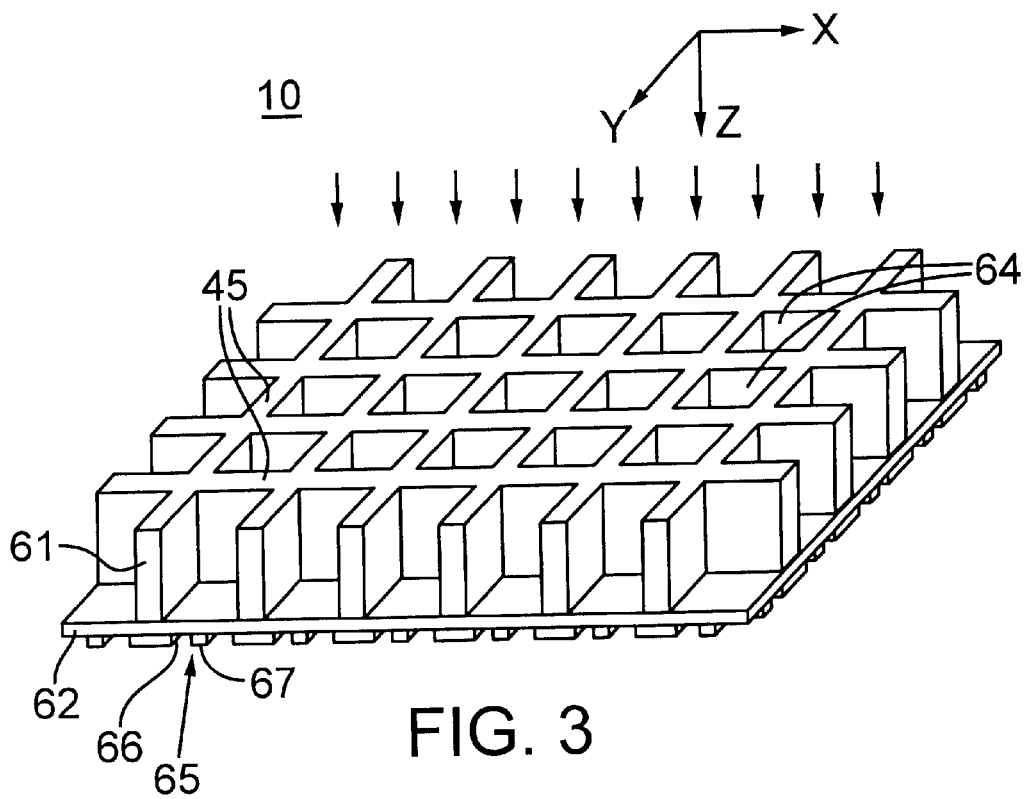
FIG. 3 is an oblique view of a portion of the reticle of FIG. 2.
Figure 4:
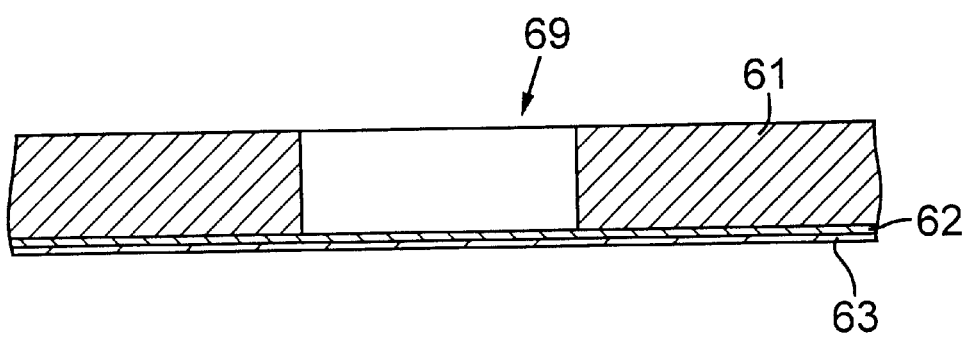
FIG. 4 is an elevational section along the line A—A in FIG. 2.

As noted above, an apparatus such as that shown in FIG. 1 can perform exposures from stenciled-membrane reticles and from non-stenciled-membrane reticles. A schematic plan view of a representative non-stenciled-membrane reticle 10 is shown in FIG. 2, showing certain structural details of the reticle. FIG. 3 is an oblique view of a patterned region of the reticle 10, and FIG. 4 is an elevational section along the line A—A in FIG. 2. The reticle pattern on this reticle 10 can be produced by scanning a resist-coated reticle blank with an electron beam, followed by etching, for example. In the following discussion, reference also is made to FIGS. 7(A) and 7(B).

Figure 7A:
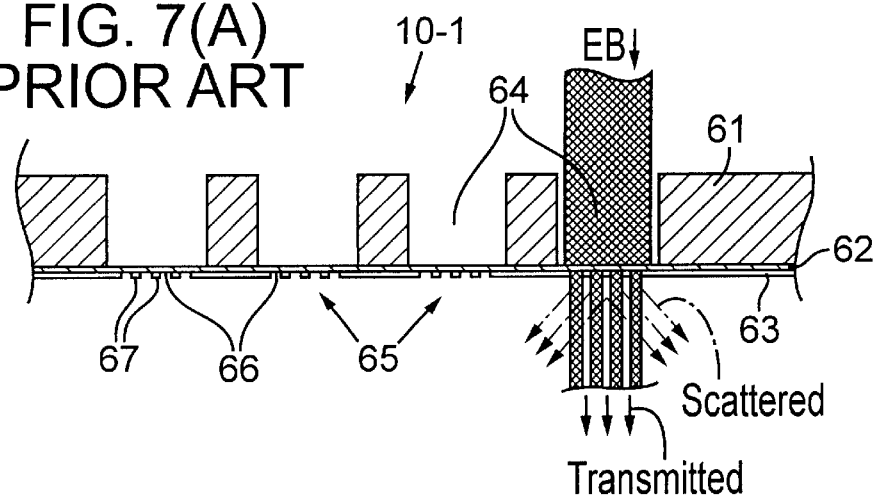
FIG. 7(A) is an elevational section of a portion of a conventional non-stenciled-membrane reticle, showing scattering and transmission behavior of particles of an incident charged particle beam at a subfield of the reticle.

As shown in FIGS. 3 and 7(A), the reticle 10 comprises a $SiN_x$ (silicon nitride) layer 62 formed on the downstream-facing surface of a Si (silicon) reticle substrate 61. The Si substrate is about 0.7 mm thick and the $SiN_x$ layer is relatively non-scattering to an incident electron beam. Formed over the $SiN_x$ layer is a W (tungsten) layer 63 that imparts substantial forward scattering to an incident electron beam. After forming the $SiN_x$ and W layers, the silicon 61 is removed (by anisotropic dry-etching or the like) from regions corresponding to the membrane subfields 64 (the subfields 64 are regions actually irradiated with the illumination beam). Thus, a self-supporting thin-film membrane 65, comprising respective portions of the $SiN_x$ and W layers, is formed at each subfield. The W-layer portion of the membrane 65 is selectively removed to form non-scattering regions 66 (the resulting "pattern" of remaining portions 67 of the W layer 63 on the $SiN_x$ layer defines the elements of the pattern, defined by the reticle, to be transferred onto the substrate 23). The thickness of the membrane 65 typically ranges from 0.01 to 0.1 μm, and each subfield 64 has a size of about 0.5 to 5.0 mm square in the X-Y plane.

The reticle 10 shown in FIG. 3 also includes beam-like members ("support struts") 45 (collectively called "grillage") that intersect each other around the membrane subfields 64. The support struts confer strength and rigidity to the reticle. The width of each strut 45 (in the X or Y direction, as applicable) is about 0.1 to 0.5 mm, for example.

Figure 2:
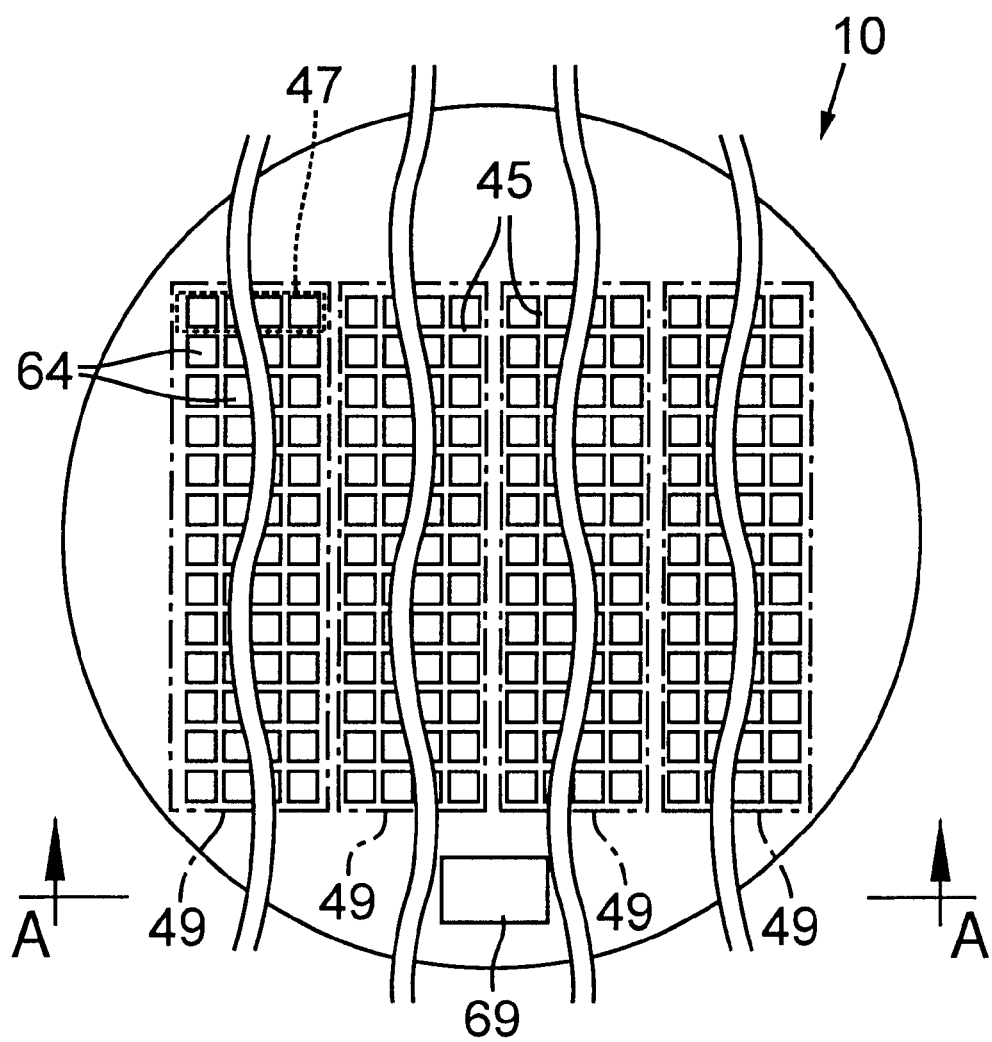
FIG. 2 is a plan view schematically illustrating certain structural features of a divided reticle, including multiple subfields and a transmitted-current-detection window, for use in an apparatus such as that of FIG. 1.

The reticle 10 depicted in FIG. 2 is circular. The subfields 64 are grouped into four "mechanical stripes" 49 that collectively are situated in the center of the reticle 10. Each mechanical stripe includes a respective array of multiple subfields 64 (see also FIGS. 3 and 7(A)) arranged in multiple parallel rows 47.

The reticle 10 also defines a transmitted-current-detection window ("measurement region") 69. The transmitted-current-detection window 69 is located separately from the mechanical stripes 49, and thus separately from the patterned region of the reticle 10. The transmitted-current-detection window 69 desirably is square or rectangular in profile, and desirably is larger (e.g., 2 mm×2 mm) than a subfield 64 (each subfield is, e.g., 1 mm×1 mm on the reticle). The size and shape of the window 69 are not limited to the foregoing examples, however. The transmitted-current-detection window 69 desirably is formed by removing the W layer 63 (or other electron-scattering material) from a corresponding region on the $SiN_x$ layer 62 in the manner shown in FIG. 4. Since the remaining $SiN_x$ layer 62 in the transmitted-current-detection window 69 and the remaining $SiN_x$ layer 62 in the reticle subfields 64 are formed from the same layer of $SiN_x$ on the same reticle substrate 61, these remaining $SiN_x$ layers have identical respective thicknesses and exhibit the same electron-transmissive behavior.

As shown in FIG. 4, silicon 61 is removed from the region of the transmitted-current-detection window 69. The silicon 61 is selectively removed from this region by anisotropic dry-etching or the like.

Figure 5:
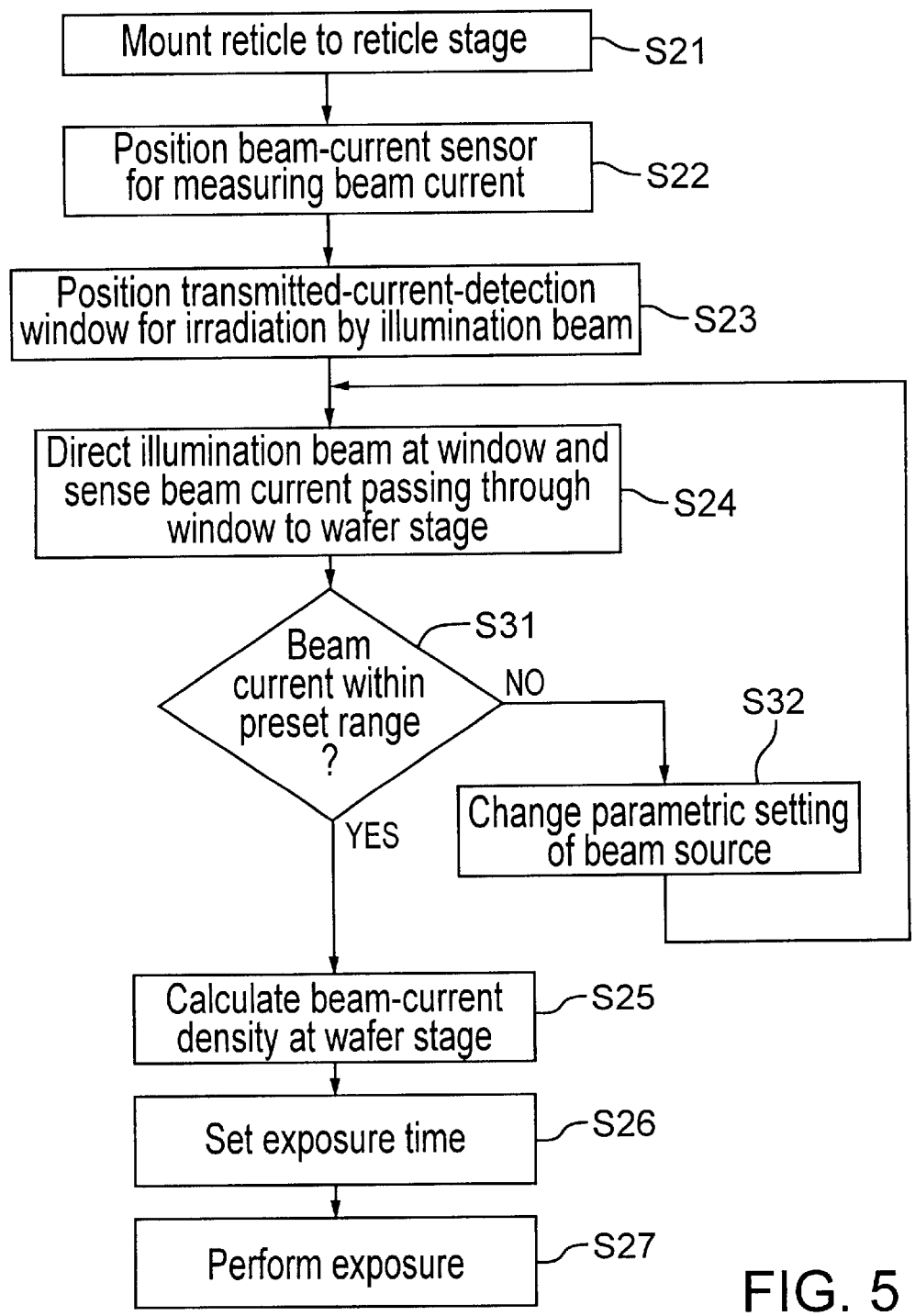
FIG. 5 is a flow chart of certain steps of an electron-beam lithographic-exposure method according to a representative embodiment.

An electron-beam exposure method (as an exemplary CPB lithographic exposure method) according to a representative embodiment is shown in FIG. 5. In a first step S21 of the method, a divided reticle 10 comprising a transmitted-current-detection window 69 (FIG. 2) is mounted on the reticle stage 11 of an electron-beam microlithography apparatus (FIG. 1). In a subsequent step S22, the wafer stage 24 including the sensor 32 (FIG. 1) is moved as required in the X-Y plane so as to place the sensor 32 at a location where it can sense the electron beam. The reticle stage 11 is then moved in the X-Y plane so as to place the transmitted-current-detection window 69 at the illumination-beam irradiation position (step S23). The transmitted-current-detection window 69 on the reticle is irradiated using the illumination beam. The beam current passing through the transmitted-current-detection window 69 to the wafer stage is sensed by the sensor 32 (step S24). The current data thus obtained is routed via the interface 32a to the main controller 31 (FIG. 1).

In step S31 a determination is made of whether the measured beam current "exceeds" (i.e., is above or below) a predetermined respective threshold (e.g., outside a range of 10 to 20 μA). If the measured beam current is above a respective threshold, then appropriate changes are made to parametric settings of the electron-beam source (e.g., change to the heating current or bias voltage of the electron gun) and/or the illumination-optical system so as to decrease the exposure time (step S32). The transmitted-current-detection window 69 is irradiated again with the electron beam, and the beam current passing through the transmitted-current-detection window 69 to the wafer stage is sensed again by the sensor 32 (step S24).

If the beam-current data obtained at step S31 is within the preset range, then the main controller 31 calculates, from the beam current sensed by the sensor 32, the beam-current density on the wafer stage (step S25). From this calculated beam-current density, the exposure time is set so that the wafer can be exposed with the specified dose (step S26), and exposure is performed (step S27).

Figure 7B:
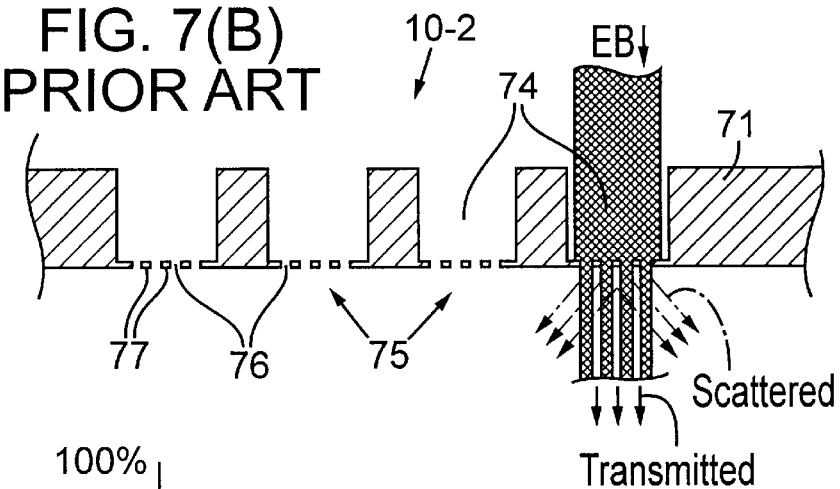
FIG. 7(B) is an elevational section of a portion of a conventional stenciled-membrane reticle, showing scattering and transmission behavior of particles of an incident charged particle beam at a subfield of the reticle.
Figure 8:
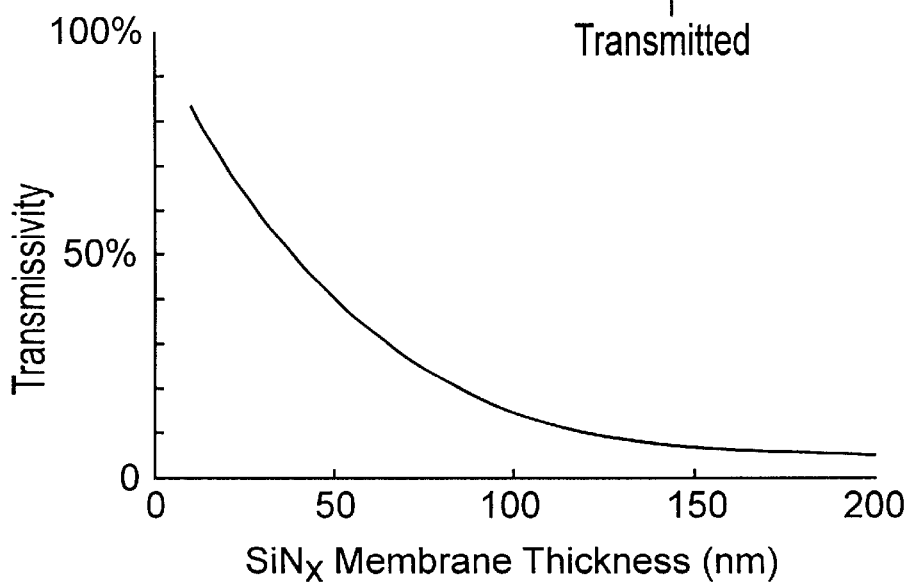
FIG. 8 is a plot of the transmissivity of an electron-transmissive portion of a conventional non-stenciled-membrane reticle.

In an alternative embodiment separate CPB microlithographic exposures are performed using a stenciled-membrane reticle (FIG. 7(B)) and a non-stenciled-membrane reticle (FIG. 7(A)). By way of example, the embodiment is described in the context of performing electron-beam microlithography.

As mentioned above, the transmissivity of a stenciled-membrane reticle is different from that of a non-stenciled-membrane reticle. Consequently, the respective exposure times required to make satisfactory lithographic exposures from each of these types of reticles also are different. As discussed above, with a non-stenciled-membrane reticle, exposure time is a function of the $SiN_x$ film thickness. The required exposure time for a non-stenciled membrane reticle is generally about 2.5 times the required exposure time using a stenciled-membrane reticle.

Accordingly, a lithographic exposure from a stenciled reticle performed using an electron-beam current adjusted for a non-stenciled-membrane reticle requires an even longer exposure time. Conversely, whenever a lithographic exposure is performed from a non-stenciled-membrane reticle using an electron-beam current adjusted for a stenciled-membrane reticle, the beam current downstream of the reticle is very high. As a result, repulsive actions between electrons in the beam (space-charge effect) cause substantial blurring of the image formed on the wafer, which prevents attainment of a desired resolution.

In this embodiment, different parametric values concerning the electron-beam source and/or illumination-optical system are preset for the non-stenciled-membrane reticle versus the stenciled-membrane reticle. Whenever a non-stenciled-membrane reticle is used, the parametric settings for the electron-beam source and/or illumination-optical system are appropriately set for use of the non-stenciled-membrane reticle. Similarly, whenever a stenciled-membrane reticle is used, the parametric settings for the electron-beam source and/or illumination-optical system are appropriately set for use of the stenciled-membrane reticle. In this regard, it is noted that controlling beam current accurately and precisely by changing the parametric settings of the electron-beam source alone is very difficult. Consequently, after the parametric settings for the electron-beam source have been made, the reticle is mounted on the reticle stage of the microlithography apparatus, and the method shown in FIG. 5 is used to direct the electron beam through the transmitted-current-detection window of the reticle. The current passing through the transmitted-current-detection window and reaching the wafer stage is detected. From the detected current, the optimal exposure time is set, and exposure is performed accordingly.

Figure 6:
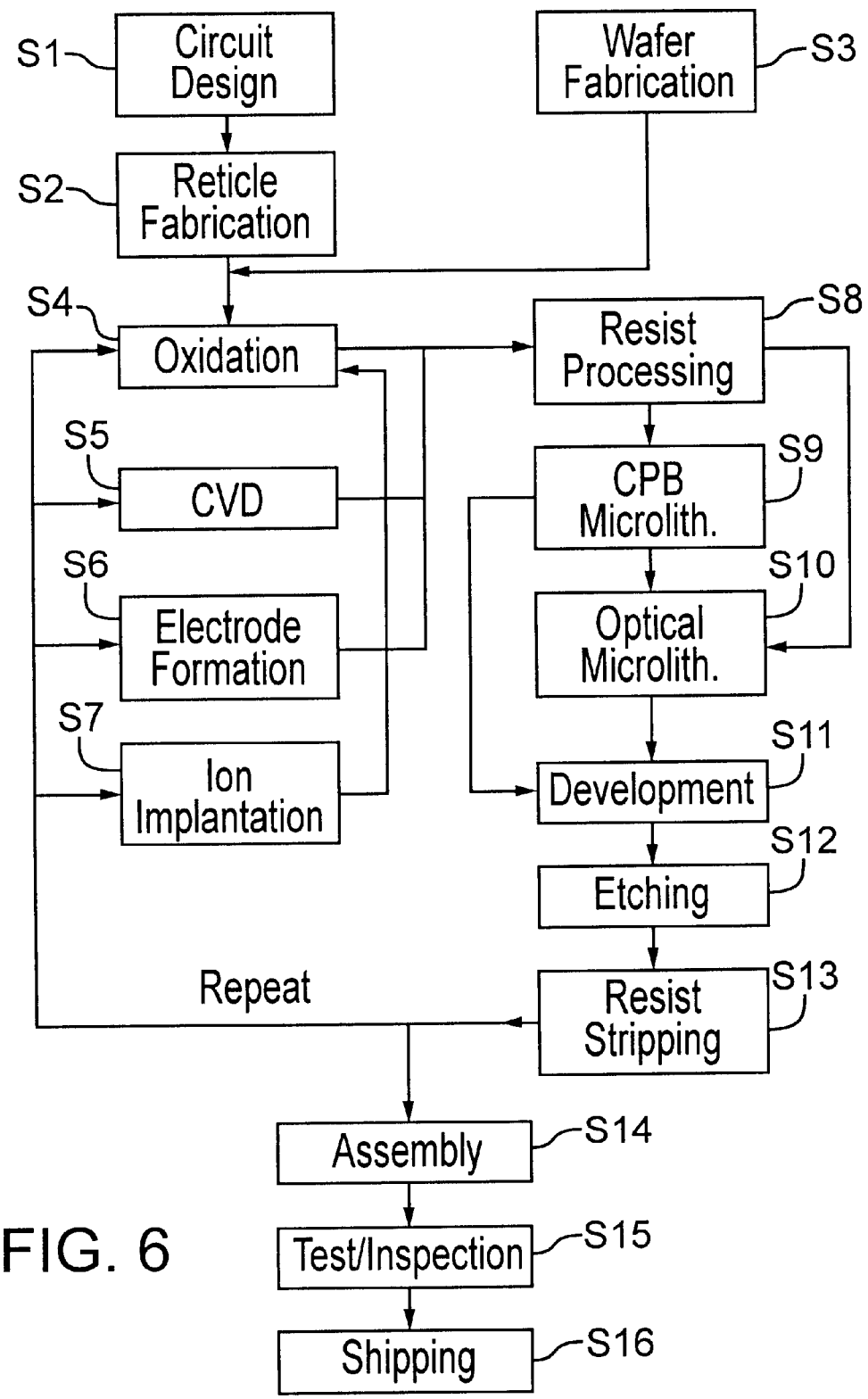
FIG. 6 is a flow chart of certain steps of a process for manufacturing a microelectronic device, the process including a lithographic-exposure method according to the invention.

FIG. 6 is a flow chart of steps in a process for manufacturing a microelectronic device such as a semiconductor chip (e.g., an LSI device), a display panel (e.g., a liquid-crystal display panel), a charge-coupled device (CCD), a thin-film magnetic pickup head, or micromachine. In step S1, (circuit design) the circuit for the device is designed. In step S2 (reticle production) a reticle or mask for the circuit is manufactured. Here, beam blurring caused by the proximity effect or by the space-charge effect may be corrected by locally resizing pattern elements as defined on the reticle. In step S3 (wafer manufacture) a wafer is fabricated from a material such as silicon or other suitable material.

Steps 4–12 are directed to wafer-processing steps, specifically "pre-process" steps, in which the circuit pattern defined on the reticle is transferred onto the wafer. Step S4 (oxidation) is an oxidation step for oxidizing the surface of a wafer. In step S5 (CVD) an insulating film is formed on the wafer surface by chemical vapor deposition. In step S6 (electrode formation) electrodes are formed on the wafer, typically by vapor deposition. In step S7 (ion implantation) ions (e.g., dopant ions) are implanted into the wafer. In step S8 (resist application) a layer of an exposure-sensitive agent ("resist") is applied to the surface of the wafer. Step S9 (CPB microlithography) involves lithographically exposing the pattern from the reticle (formed in step S2) to the resist so as to imprint the resist with the reticle pattern, as described elsewhere herein. Step S1 (optical exposure) is an optional step in which an optical microlithography reticle made in step S2 is used for exposing an image of the reticle pattern on the resist by means of an optical "stepper." Before or after this step, exposure may be performed in a manner serving to correct proximity effects, wherein the effects of backscattered charged particles of the beam in the resist are made substantially uniform. In step S11 (development) the exposed resist is developed on the wafer. In step S12 (etching) the wafer is subjected to a suitable etching condition that selectively removes portions of the wafer surface not protected by the developed resist. Step S13 (resist removal) involves stripping away remaining resist from the wafer after the etching step. By repeating steps S4–S13 as required, circuit patterns as defined by successive reticles are superposedly formed on the wafer.

Step S14 (assembly) is a "post-process" step, in which the wafer that has passed through steps S4–S13 is formed into chips. This step can include, e.g., assembling the devices (dicing and bonding) and packaging (encapsulation of individual chips), and other such steps. In step S15 (inspection) any of various operability, qualification, and durability tests of the devices produced in step S14 are conducted. Devices that successfully pass step S15 are finished, packaged, and shipped (step S16).

As evident from the foregoing, and according to various aspects of the present invention, a non-stenciled-membrane reticle is mounted in a CPB microlithography apparatus. An illumination beam is directed at a transmitted-current-detection window provided in the reticle. Beam current reaching the wafer from the transmitted-current-detection window is measured, and the appropriate exposure time for the particular reticle is calculated and set based on the measurement data and on other preset exposure parameters. This allows the exposure dose for the particular reticle to be controlled accurately and precisely, regardless of the membrane thickness of the non-stenciled-membrane reticle. This also allows a more relaxed tolerance of the thickness of the reticle membrane during production of the non-stenciled-membrane reticle, which reduces reticle cost.

Also, since parametric settings of the source of the illumination beam can be changed according to the type of reticle (non-stenciled-membrane reticle versus stenciled-membrane reticle), the desired beam current is obtained for good exposure. Thus, situations are avoided in which the required exposure time differs greatly whenever a non-stenciled-membrane reticle is used together with a stenciled-membrane reticle, thereby increasing throughput.

Whereas the invention has been described in connection with several representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. In a charged-particle-beam (CPB) microlithographic exposure method, a method for achieving desired exposure doses on a substrate from one reticle to another, the method comprising:

placing a reticle relative to a charged-particle illumination beam, the reticle defining a pattern to be transferred onto a sensitive substrate and comprising a CPB-transmissive membrane layer and a CPB-scattering layer selectively formed on the CPB-transmissive membrane layer, through which CPB-scattering layer the illumination beam can pass with substantial scattering of charged particles of the beam, and through which CPB-transmissive membrane layer the illumination beam can pass with relatively little scattering, the CPB-scattering layer and CPB-transmissive membrane layer collectively defining elements of the pattern on the reticle, and the charged particles of the beam propagating downstream of the reticle collectively defining a patterned beam;

blocking propagation of charged particles of the patterned beam that were scattered by passage through the CPB-scattering layer so as to prevent the blocked charged particles from propagating to the substrate;

projecting and imaging non-scattered charged particles of the patterned beam onto the substrate;

irradiating the illumination beam on a measurement region of the reticle at which only the CPB-transmissive membrane layer is present, and measuring a beam current of the resulting patterned beam propagating downstream of the region to the substrate; and from a pre-set target exposure dose for the substrate and from the measured beam current, determining an actual exposure condition for the reticle so as to achieve, using the particular reticle and from one reticle to another, the desired exposure dose on the substrate within a desired exposure time.

2. The method of claim 1, wherein:

the illumination beam is generated by a CPB source and passed through an illumination-optical system to the reticle; and if the measured beam current deviates significantly from a previously specified beam current, then at least one of the CPB source and illumination-optical system is adjusted so as to bring the beam current on the substrate within a desired range including the previously specified beam current.

3. The method of claim 1, wherein the exposure condition is an exposure time.

4. The method of claim 3, wherein the exposure time is different depending upon whether the reticle is a stenciled-membrane reticle or a non-stenciled-membrane reticle.

5. An electron-beam microlithographic exposure method performed using an electron-beam microlithographic exposure device comprising an illumination-beam source, an illumination-optical system through which the illumination beam passes, a reticle stage, a projection-optical system through which a patterned beam passes, and a substrate stage including a beam-current sensor, the method comprising:

mounting a reticle on the reticle stage relative to the illumination beam, the reticle defining electron-transmitting (and non-forward-scattering) regions and electron-forward-scattering regions that collectively define a pattern on the reticle, and a transmitted-current-detection window that is as transmissive and non-forward scattering to the illumination beam as any of the electron-transmitting regions of the reticle;

moving the substrate stage to place the beam-current sensor in a beam-current-sensing position;

moving the reticle stage to place the transmitted-current-detection window at an illumination-beam-irradiation position;

irradiating the transmitted-current-detection window with the illumination beam, while measuring a beam current of the resulting patterned beam with the beam-current sensor;

determining whether the measured beam current is outside a predetermined beam-current range defined between lower and upper thresholds;

if the measured beam current is outside the predetermined range, then changing at least one parametric setting of at least one of the illumination-beam source and illumination-optical system so as to bring the measured beam current within the predetermined range; and from the measured beam current within the predetermined range, calculating a beam-current density at the substrate stage and an exposure time for exposing the substrate with a specified dose using the reticle and from one reticle to another.

6. The method of claim 5, including the step of changing the exposure time depending upon whether the reticle is a non-stenciled-membrane reticle or a stenciled-membrane reticle.

7. In a charged-particle-beam (CPB) microlithographic exposure method in which a pattern defined by a reticle is transferred from the reticle to a sensitive substrate, a method for controlling exposure at the substrate, comprising;

placing a reticle relative to a charged-particle illumination beam produced by a CPB source and passing through an illumination-optical system, the reticle defining a pattern to be transferred onto a sensitive substrate; and depending upon whether the reticle is a stenciled-membrane reticle or a non-stenciled-membrane reticle, adjusting one or both the CPB source and illumination-optical system accordingly to achieve a desired exposure dose at the sensitive substrate within a desired exposure time from one reticle to another.

8. The method of claim 7, further comprising the step, after at least one of the CPB source and illumination-optical system have been adjusted according to the type of reticle, of measuring a CPB beam current as incident on the sensitive substrate.

9. The method of claim 8, further comprising the step of determining exposure conditions for the substrate from the measured CPB beam current and from a preset exposure dose.

10. A charged-particle-beam (CPB) microlithographic exposure apparatus, comprising:

a CPB source that emits an illumination beam toward a reticle defining a pattern to be transferred to a sensitive substrate;

a reticle stage on which the reticle is mounted;

an illumination-optical system situated between the CPB source and the reticle stage and configured to irradiate a region of the reticle with the illumination beam;

a projection-optical system situated downstream of the reticle stage and configured to project and image a patterned beam, propagating downstream of the reticle and comprising scattered and non-scattered charged particles of the illumination beam passing through the illuminated region of the reticle, onto the sensitive substrate;

a substrate stage, situated downstream of the projection-optical system, on which the sensitive substrate is placed for exposure, the substrate stage comprising a beam-current sensor; and a controller connected to and configured to control respective operations of the CPB source, the illumination-optical system, the reticle stage, the projection-optical system, the substrate stage, and the beam-current sensor;

wherein a beam current of the patterned beam reaching a position on the sensitive substrate is measured by the beam-current sensor, and the controller is configured to calculate exposure conditions for achieving a desired exposure dose on the sensitive substrate within a desired exposure time, based on which of a plurality of types of reticles is mounted to the reticle stage and based on the beam current sensed by the beam-current sensor, so as to achieve a desired exposure time from one reticle to another.

11. The apparatus of claim 10, wherein, whenever a reticle is mounted to the reticle stage, the controller adjusts a parameter of at least one of the CPB source and illumination-optical system based on the type of reticle mounted to the reticle stage.

12. The apparatus of claim 10, wherein the reticle mountable to the reticle stage is selected from the group consisting of stenciled-membrane reticles and non-stenciled-membrane reticles.

13. A method for manufacturing a microelectronic device, comprising a CPB microlithographic exposure method as recited in claim 1.

14. A microelectronic device produced by the method recited in claim 13.

15. A method for manufacturing a microelectronic device, comprising an electron-beam microlithographic exposure method as recited in claim 5.

16. A microelectronic device produced by the method recited in claim 15.

17. A microlithography method performed using the apparatus recited in claim 10.

18. A microelectronic device produced by the method recited in claim 17.

* * * * *

UNITED STATES PATENT AND TRADEMARK OFFICE
CERTIFICATE OF CORRECTION

PATENT NO.     : 6,627,906 B2
DATED          : September 30, 2003
INVENTOR(S)    : Hirayanagi It is certified that error appears in the above-identified patent and that said Letters Patent is hereby corrected as shown below:

Column 11,
Line 37, delete "S1" should be -- S10 --.

Signed and Sealed this

Thirtieth Day of March, 2004

JON W. DUDAS
*Acting Director of the United States Patent and Trademark Office*